(12) United States Patent
Matayabas, Jr. et al.

(10) Patent No.: US 6,597,575 B1
(45) Date of Patent: Jul. 22, 2003

(54) ELECTRONIC PACKAGES HAVING GOOD RELIABILITY COMPRISING LOW MODULUS THERMAL INTERFACE MATERIALS

(75) Inventors: James C. Matayabas, Jr., Chandler, AZ (US); Paul Koning, Chandler, AZ (US); Jinlin Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/035,209

(22) Filed: Jan. 4, 2002

(51) Int. Cl.⁷ ................................. H05K 7/20
(52) U.S. Cl. .............. 361/705; 165/80.2; 165/185; 257/707; 257/713; 257/789; 361/708; 361/717; 361/718; 428/450; 524/401; 524/404; 524/428
(58) Field of Search ............ 165/80.2, 185; 174/16.3; 361/688, 704–711, 717–722; 257/706–707, 712–713, 787–795; 524/400–401, 394, 428–429; 428/40.5, 41.3, 450

(56) References Cited

U.S. PATENT DOCUMENTS

| | | | |
|---|---|---|---|
| 4,838,347 A | * | 6/1989 | Dentini et al. ............. 428/329 |
| 4,974,119 A | | 11/1990 | Martin |
| 5,137,959 A | | 8/1992 | Block et al. |
| 5,781,412 A | * | 7/1998 | De Sorgo .................. 361/704 |
| 5,931,222 A | * | 8/1999 | Toy et al. ................... 361/708 |
| 5,978,223 A | | 11/1999 | Hamilton et al. |
| 5,989,459 A | | 11/1999 | Nguyen et al. |
| 6,020,424 A | | 2/2000 | Osuna et al. |
| 6,054,198 A | | 4/2000 | Bunyan et al. |
| 6,096,414 A | | 8/2000 | Young |
| 6,162,663 A | | 12/2000 | Schoenstein et al. |
| 6,188,576 B1 | | 2/2001 | Ali et al. |
| 6,204,303 B1 | | 3/2001 | Osuna et al. |
| 6,210,520 B1 | | 4/2001 | Osuna et al. |
| 6,218,730 B1 | | 4/2001 | Toy et al. |
| 6,238,596 B1 | | 5/2001 | Nguyen et al. |
| 6,311,769 B1 | * | 11/2001 | Bonneville et al. ......... 361/704 |
| 6,469,379 B1 | * | 10/2002 | Matayabas ................. 257/706 |

* cited by examiner

Primary Examiner—Gregory Thompson
(74) Attorney, Agent, or Firm—Antonelli, Terry, Stout & Kraus, LLP

(57) ABSTRACT

An electronic package includes a heat-generating electronic component such as an integrated circuit chip, a thermally conductive member, which may be an integrated heat spreader, and a low modulus thermal interface material in heat conducting relation between the electronic component and the thermally conductive member. Increased thermal performance requirements at the electronic component level are met by the thermal interface material, which includes a polymer matrix and thermally conductive filler, which has a storage shear modulus (G') at 125° C. of less than about 100 kPa, and which has a gel point, as indicated by a value of G'/G" of $\geq 1$, where G" is the loss shear modulus of the thermal interface material. The values for G' and G" are measured by a strain-controlled rheometer.

20 Claims, 9 Drawing Sheets

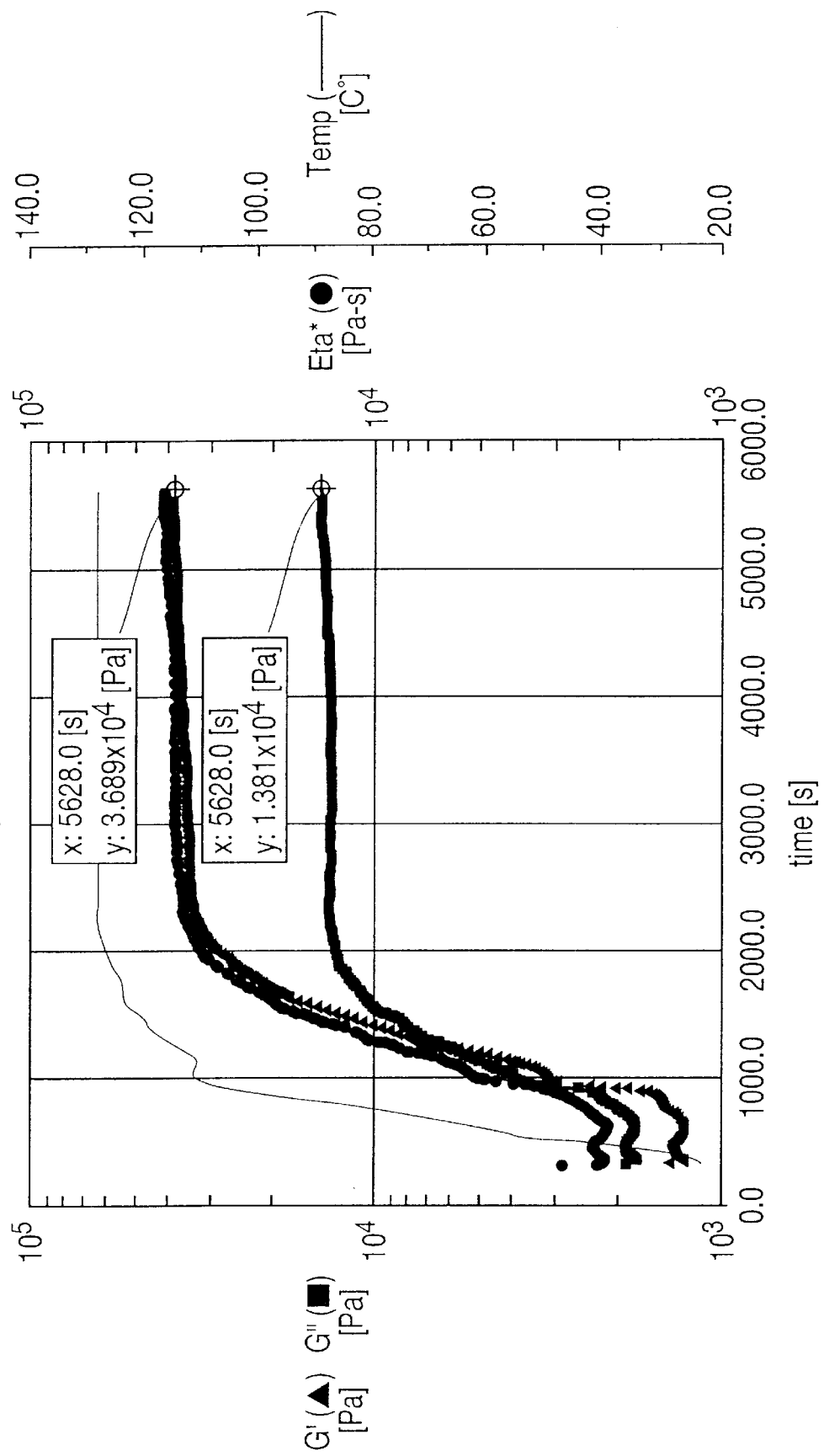

AFTER ASSEMBLY (BEFORE BAKE)

AFTER 125°C BAKE FOR 384 HRS.

ELECTRONIC PACKAGES HAVING GOOD RELIABILITY COMPRISING LOW MODULUS THERMAL INTERFACE MATERIALS

FIELD

This invention relates to an improved electronic package and a curable material useful as a thermal material therein.

BACKGROUND

Electronic components such as integrated circuit chips can generate sufficient heat so that a heat dissipation arrangement must be provided. A common expedient for this purpose is to transfer heat from the component using a thermally conductive member, for example an integrated heat spreader and/or a heat sink, thermally connected to the circuit board or component. A thermal interface material (TIM) is used between the component or circuit board and the thermally conductive member to establish thermal contact and lower the thermal resistance. The TIM technologies used for electronic packages encompass several classes of materials such as phase change materials, epoxies, greases, and gels.

Due to the increasing performance demands for electronic components such as microprocessors, improving heat dissipation is one of the central issues. The recent trend in microprocessor architecture has been to increase the number of transistors (higher power), shrink processor size (smaller die), and increase clock speeds (high frequency) in order to meet the market demand for high performance microprocessors. These have resulted in the escalation of both the raw power as well as the power density (hot spots) at the silicon die level, which increase the demand for effective means of heat dissipation.

High performance, high power processors require the use of integrated heat spreaders. The well-known thermal greases, epoxies and phase change TIM materials that are currently available in the market do not meet the performance requirement for packages comprising an integrated heat spreader. In response, highly conductive, low modulus, crosslinked gel TIMs were developed.

U.S. Pat. No. 6,238,596 discloses a method of improving the thermal conductivity of gel TIM polymer systems by incorporating carbon microfibers, with other fillers, in the thermal interface material. Other solutions to the demand for increasingly effective heat dissipation have also been proposed. In U.S. Pat. No. 6,218,730, by means of mechanical standoffs, the TIM gap is reduced to provide a shorter heat transfer path and thereby a reduction in the thermal resistance of the TIM. Improvements in packaging design include those disclosed in Assignee's U.S. Pat. No. 6,188,576, which account for varying amounts of heat generated by separate chips within a package. Imparting a consistent TIM thickness and thereby allowing the uniform transfer of heat are named advantages of the techniques for the application of TIMs by screen printing the TIM composition upon a substrate to form a layer followed by curing the layer, disclosed in U.S. Pat. Nos. 6,020,424 and 6,210,520.

A method of making a heat dissipation arrangement involving the formation of a gel pad on the inner surface of a heat spreader to cover exposed faces of chips on a circuit board is described in U.S. Pat. No. 6,162,663. Properties of the gel pad are specified to dissipate heat while at the same time physically protecting the chip from mechanical stresses or avoiding the transmission of such stresses to the bare silicon chips. A cured gel TIM to form the pad is specified to have a cohesive strength greater than its adhesive strength, a compressive modulus of less than 1.38 MPa, and a thermal conductivity of greater than 1.0 W/m° C.

Gel TIMs typically comprise a crosslinkable silicone polymer, such as a vinyl-terminated silicone oil, a crosslinker, such as a silane hydride crosslinker, and a thermally conductive filler. Before cure, these materials have properties similar to greases. They have high bulk thermal conductivities and low surface energies, and they conform well to surface irregularities upon dispense and assembly, which contributes to thermal contact resistance minimization. After cure, gel TIMs are crosslinked, filled polymers, and the crosslinking reaction provides cohesive strength to circumvent the pump-out issues exhibited by greases during temperature cycling. Their modulus (E) is low enough (on the order of mega-pascal, MPa, range compared to giga-pascal, GPa, range observed for epoxies) that the material can still dissipate internal stresses and prevent interfacial delamination. Thus, the low modulus properties of these filled gels are attractive from a material integration standpoint.

However, it is often found that maintaining low thermal interface resistance in electronic packages employing gel TIMs currently used in the industry, is difficult. This is especially true for organic flip-chip packages, which introduce significant thermal-mechanical stress on the thermal interface material during reliability stress testing from the relative flexing of the die and the heat spreader with changes in temperature due to the differences in their coefficients of thermal expansion. One of the main technical challenges for gel TIM formulation is optimizing the mechanical properties such that the cured gel dissipates the thermal-mechanical stresses that arise due to the mismatch of thermal expansion coefficients of the chip and heat spreader, to thereby avoid delamination of the gel TIM. There is in need for an improved electronic package comprising a gel TIM, which can reliability meet not only the end of line package performance requirements but also the end of life performance requirements.

BRIEF DESCRIPTION OF DRAWINGS

FIG. 2A are curves of G' and G" as a function of curing time measured by a strain-controlled rheometer, particularly a Rheometric Dynamic Analyzer (RDA) for a thermal material (TIM 1) of the invention.

DETAILED DESCRIPTION

Figure 1:
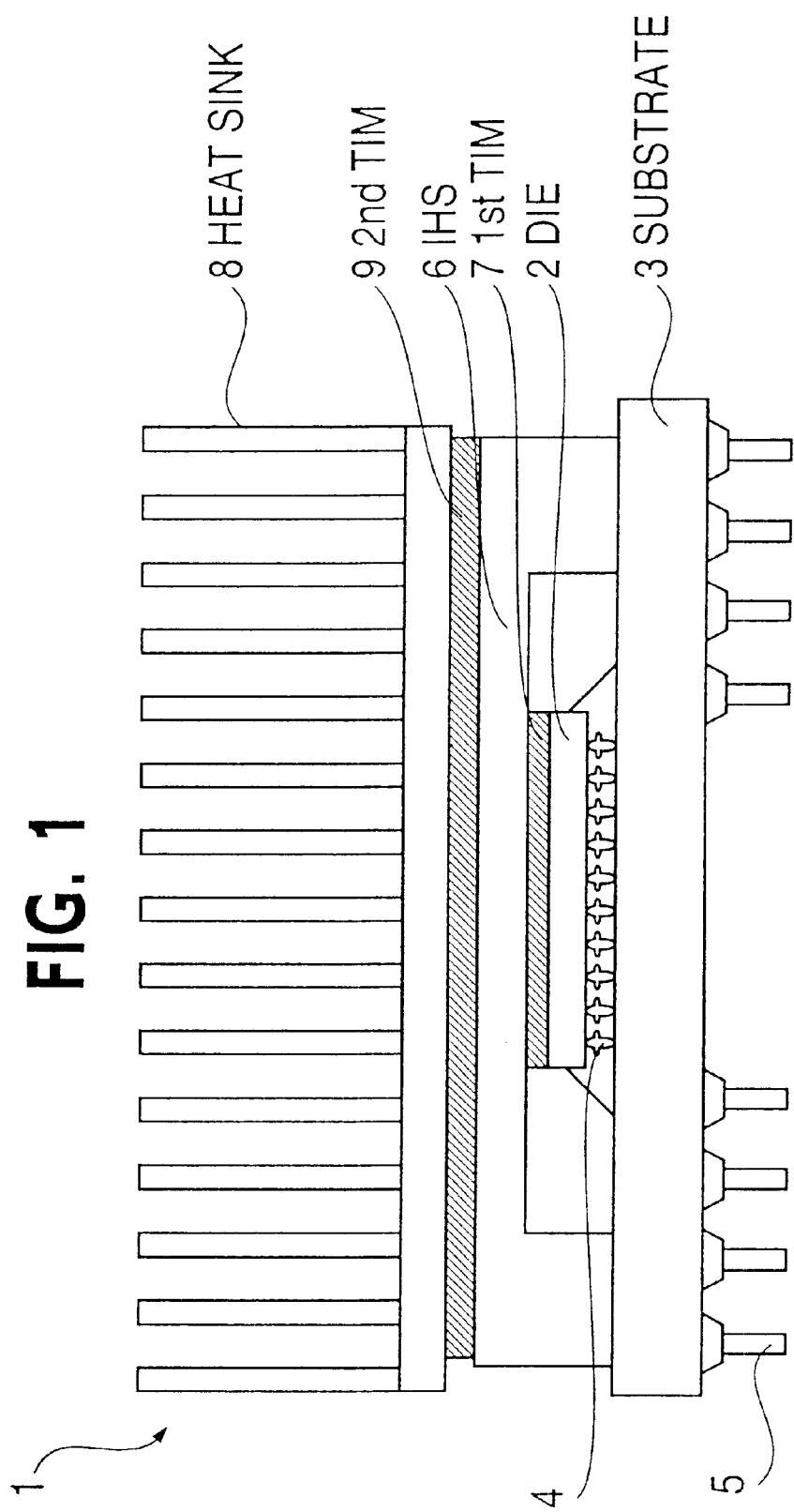
FIG. 1 is a cross-sectional view, not to scale, of an electronic package according to an example embodiment of the invention.

Referring now to the drawings, an electronic package 1 according to an example embodiment of the invention is depicted in FIG. 1. The electronic package is a processor assembly in the example embodiment, comprising a heat-generating electronic component 2 in the form of an integrated circuit chip or die. The chip is electrically coupled on its front, lower side to a substrate 3 of the package by soldered connections 4 which join the chip to a printed circuit or other electrical structure on the upper surface of the substrate. A plurality of interconnectors 5 in the form of pins protrude from the lower surface of the substrate for electrically connecting the chip 3 within the package in a computer, for example. A thermally conductive member 6, more particularly an integrated heat spreader, is mounted on the substrate at its periphery with a central, planar surface of the heat spreader extending over the back side of the chip. A thermal interface material 7 according to the present invention is located in heat conducting relation between the back of the chip and the heat spreader. The package further includes another thermally conductive member, namely a heat sink 8. The heat sink is mounted on the package in heat conducting relation with the integrated heat spreader via a further thermal interface material 9.

The thermal interface material 7 in the package includes a polymer matrix and thermally conductive filler. According to the invention, the thermal interface material is formulated to have a storage shear modulus (G') at 125° C. of less than about 100 kPa, and to have a gel point, as indicated by a value for G'/G" of greater than or equal to (one, e.g., $\geq 1$) 1, where G" is the loss shear modulus of the thermal interface material. It has been found that with these mechanical properties, the package has good reliability and meets performance requirements for heat dissipation in high performance microprocessors for both end of line and end of life. A thermal interface material with these properties has been found to minimize the thermal contact resistance $R_c$ between the interface material and the adjacent surfaces of the chip and the integrated heat spreader, while avoiding delamination of the TIM with the adjacent components and degradation of thermal performance in reliability tests.

Figure 6:
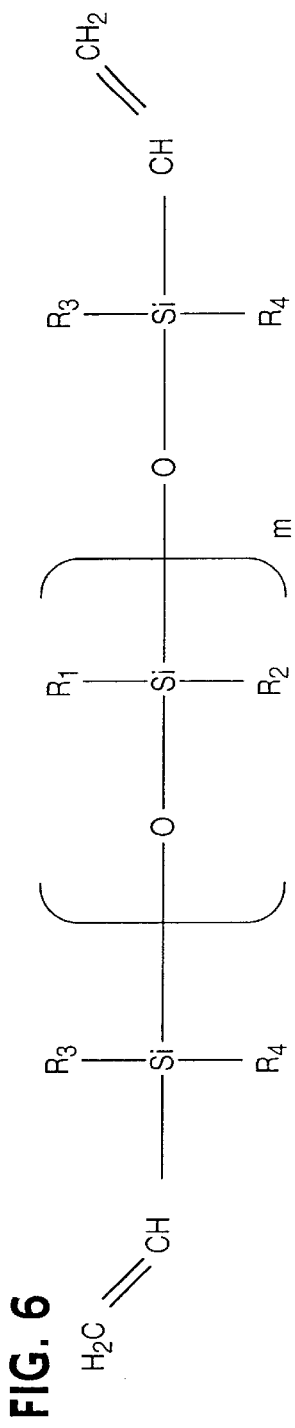
FIG. 6 is a diagram illustrating a polymer chain as one structure component in a formulation of a curable TIM according to one example embodiment of the invention.

In the example embodiment, the thermal interface material 7 is a cured silicone-based gel wherein the polymer matrix is a crosslinked silicone polymer, but it is envisioned that other polymer matrices could be used for the TIM, such as those based on polyurethanes, polyureas, anhydride-containing polymers and the like. In the example embodiment, the crosslinkable silicone polymer employed in the uncured TIM is a vinyl terminated silicone polymer, e.g., a silicone oil based composition. FIG. 6 is a diagram illustrating a polymer chain of this material as one structure component in a formulation of the curable TIM according to the example embodiment.

From FIG. 6, it is apparent that the structure component includes at least one unit of oxygen-silicone (O—Si) and an plurality of hydrocarbons to make up the silicon oil and vinyl groups. The O—Si group in parenthesis represents a polymer. The subscript "m" to the polymer is the degree of polymerization and represents a polymer chain of the structure component where "m" is in the range of 10–1000 (e.g., when "m" is equal to 10, the polymer chain is 10 polymer units long, etc.). The silicone-oil base (i.e., O—Si—O—Si with hydrocarbons) when combined with vinyl (e.g., CH double bond (═) $CH_2$) forms a vinyl-terminated silicone oil having the structure component in FIG. 6 (where CH is carbon hydrate and $CH_2$ is methylene radical). The vinyl groups are at the ends of the polymer chain. The vinyl-termination of the silicone oil is denoted by the symbol "$H_2C$═CH—" or "—CH═$CH_2$". The vinyl-terminated silicone oil structure of FIG. 6 includes a plurality of hydrocarbons $C_1$ to $C_{26}$. These hydrocarbons are denoted by $R_1$ to $R_4$. It is contemplated that $R_1$, $R_2$, $R_3$ and $R_4$ are independently selected from $C_1$ to $C_{26}$. In other words, $R_1$, $R_2$, $R_3$ and $R_4$ can be selected to be the same or to be different. In the example embodiment, silicone oil is vinyl terminated poly(diethyl siloxane) (i.e., the structure component where $R_1$, $R_2$, $R_3$ and $R_4$ are methyl ($C_1$).

Figure 7:
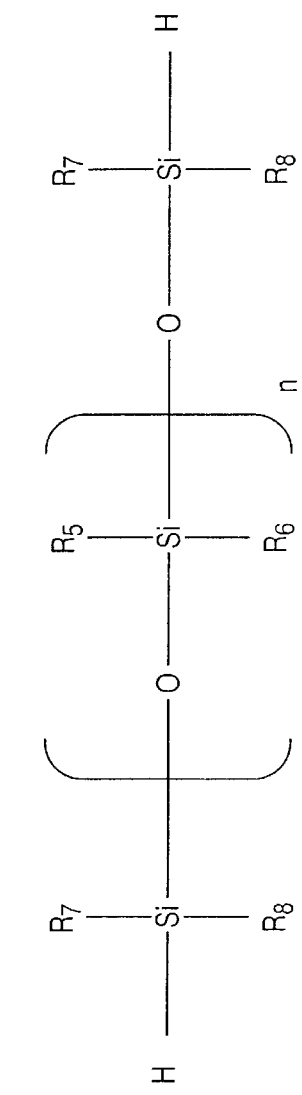
FIG. 7 is a diagram illustrating a chain extender as one structure component in the formulation of the curable TIM according to the example embodiment of the invention.

The thermal interface material 7 of the example embodiment further comprises a crosslinker and a chain extender. In the example embodiment, the crosslinker is a silane hydride crosslinker and the chain extender is a silicone polymer having terminal siloxane hydride units. FIG. 7 is a diagram illustrating a chain extender as one structure component in the formulation of the curable TIM according to the example embodiment. The structure component in FIG. 7 includes a silicone oil based material, which is represented by the parenthesis with the subscript "n" (where "n" is a positive whole number which may be in the range of 10–200) and Si—H/H—Si (silicone hydrate) at two ends of the silicone oil (e.g., O—Si—O—Si—O—Si, etc., chain structure). The chain extender or structure component may be long or short depending on the number of polymer (O—Si) composition used in the structure. In other words, the degree of polymerization of the chain extender depends on the number "n" used and can range from approximately 10 to approximately 10,000. The chain extender structure component (H-terminated silicone oil) of FIG. 7 used as the chain extender for the polymer chain described in FIG. 6 has two hydrogen (H) components located at the two ends of the silicone oil based material (O—Si—O—Si chain). The chain extender also includes a plurality of hydrocarbons $C_1$ to $C_{26}$, which are denoted by $R_5$ to $R_8$. The $R_5$, $R_6$, $R_7$ and $R_8$ components are independently selected from the $C_1$ to $C_{26}$ hydrocarbons group. In the example embodiment, the chain extender is hydrogen terminated poly(dimethylsiloxane) (i.e., the structure component in FIG. 7 where $R_5$, $R_6$, $R_7$ and $R_8$ are methyl ($C_1$)). The extender is combined with the vinyl-terminated silicone oil to control the modulus, i.e., storage shear modulus G' of the gel TIM.

Figure 8:
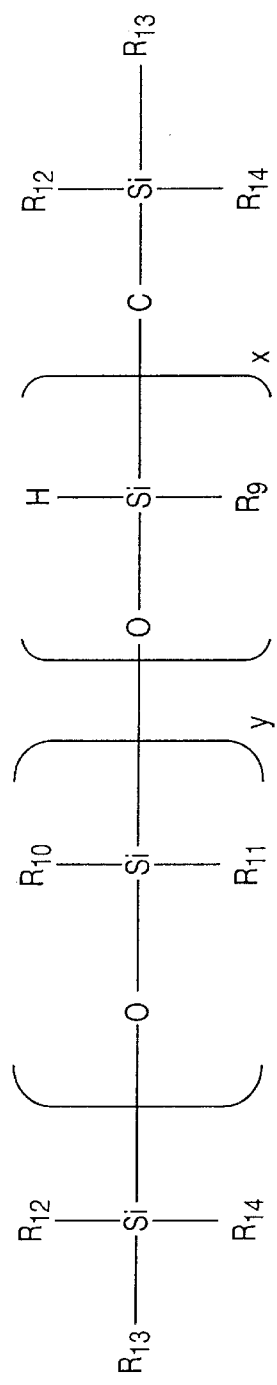
FIG. 8 is a diagram illustrating a crosslinker as one structure component in the formulation of the curable TIM according to the example embodiment of the invention.

The crosslinker in the thermal interface material 7 of the example embodiment is a silicone crosslinker whose structure is shown in FIG. 8. As seen therein, the structure includes at least one polymer unit (shown in parenthesis with a subscript "y"), at least one crosslinkable unit (shown in bracket with a subscript "x"), silicone and a plurality of hydrocarbons $C_1$ to $C_{26}$, which are denoted by $R_9$ to $R_{14}$. $R_9$ to $R_{14}$ are independently selected from the hydrocarbons $C_1$ to $C_{26}$ group. In the example embodiment, $R_1$ to $R_{14}$ are all methyl ($CH_3$). The subscripts "x" and "y" are the degrees of polymerization where "x" is in the range of 3–100 and "y" is in the range of 10–10,000. The crosslinker when combined with the vinyl terminated silicone oil together with other additives form a basic formulation of the gel TIM. However, in the example embodiment in order to obtain the desired low modulus to meet the needs for high performing processors, some of the crosslinker is replaced with the chain extender to obtain a reduced modulus G'. That is, the ratio of the chain extender of FIG. 7 to the crosslinker of FIG. 8 is controlled such that the mole fraction of Si—H equivalents from the chain extender to the total Si—H equivalents from both the crosslinker and the chain extender in the formulation is in the range of 0.1 to 1. More specifically, in the example embodiment, this ratio is approximately 0.6.

It is contemplated that the TIM formulation may contain more than one chain extender and/or crosslinker. The crosslinker of FIG. 7 in the formulation comprises a plurality of silicone hydride (Si—H) units. The chain extender of FIG. 8 comprises two Si—H units. These two Si—H units are located at the two ends of the polymer chain as noted previously. The chain extender helps reduce the number of crosslinks in the curable TIM. This results in the reduction of the storage shear modulus G' that reduces the thermal resistance due to the TIM. With low resistance in the package, the device (i.e., a central processing unit) can operate at faster speeds since the TIM with low resistance can get more heat out from the device. It has been found that by reducing the storage shear modulus G' of the cured gel TIM to less than about 100 kPa with the material having a gel point, as indicated by a value of G'/G" of $\geq 1$, where G" is the loss shear modulus of the cured thermal interface material, a good reliability for high performance electronic packages can be obtained both at end of line as well as post reliability testing as discussed further below. More particularly, a preferred, upper limit for G' is less than 70 kPa (at 120° C.) with the material having a gel point as described above.

The gel TIM formulation in the example embodiment includes a platinum catalyst. The chain extender is also approximately the size of the crosslinker in the formulation (i.e., the value of "n" in the chain extender is about the same as the sum of the values of "y" and "x" in the crosslinker structure). The cross-linkable TIM is formulated by mixing the components together to produce a gel which may be applied by dispensing methods to any particular surface and cured at a certain temperature (i.e., room temperature/125° C., or other temperature). The aforementioned components of the gel TIM formulation are combined to form a low modulus G' gel TIM formulation. The order that the components are combined together is not critical to the formulation of the TIM. In addition to the Pt catalyst, other additives to aid the curing reaction can be included in the composition. The ratio of silicone Si—H equivalents from the chain extender to the silicone-hydrogen equivalents from the crosslinker is adjusted such that it yields the desired modulus G' value.

The crosslinking reaction that occurs during cure involves the formation of a silicone-carbon bond by reaction of the vinyl group with the silicone hydride group. It is noted that it is well known to those skilled in the art that the silicone-hydrogen to silicone-vinyl molar ratio is a critical formulation parameter for controlling the properties of the silicone matrix after cure. However, a wide range of values can be used in the practice of this invention. The value of silicone-hydrogen to silicon-vinyl ratio is preferably in the range of about 2 to 0.6. The use of silicone-hydrogen to silicone-vinyl values outside this range may result in materials that have G' values outside of the desired range. In the example embodiment, the silicone-hydrogen to silicone-vinyl ratio is approximately 1.0.

Since the chain extension technology forms linear, high molecular weight silicone polymers during cure, the base silicone oil can have a wide range of molecular weights. However, silicone oils with low molecular weights are desirable because lower molecular weight silicone oils provide TIMs with improved processability due to their reduced viscosity before cure. Moreover, thermally conductive fillers of the TIM due to reduced entropy loss upon becoming confined to the surface of the filler and permits higher filler loadings, which provide higher bulk thermal conductivities.

The thermally conductive filler of the TIM 7 of the example embodiment is an important component for improving the bulk thermal conductivity of the thermal material. The thermal material of the example embodiment has a bulk thermal conductivity of 3.4 W/mK. Although the filler selection and weight percent in the formulation are key parameters for the performance of the thermal interface material, these parameters are well understood by those skilled in the art and are not critical to the practice of the invention. Therefore, a wide variety of fillers and filler loadings can be used in the practice of the invention. Examples of these fillers include metals, such as aluminum, silver, copper and the like; ceramics, such as aluminum nitride, aluminum oxide, zinc oxide, boron nitride, aluminum nitride, and the like; silver coated aluminum, carbon fibers, alloys and any combinations thereof Similarly, a wide variety of filler average particle sizes and particle distributions can be used in the practice of the invention. Fillers with larger average filler sizes provide higher bulk thermal conductivities; however, they also give higher bond line thicknesses that reduce thermal performance. Therefore, the average particle size must be selected in a range that balances these factors for a high performance formal interface material. Typically, the average particle size is less than about 300 microns. In the example embodiment, the average particle size is less than approximately 30 microns.

Gel TIMs comprising chain extension technology can be cured over a wide range of temperatures and/or times. The cure time and temperature can be controlled by the choices of catalyst selection, catalyst concentration, and the optional use of catalyst inhibitors and retarders, known to those skilled in the art. In general, the chain extenders react more quickly than typical silicone crosslinkers, and, therefore, typically require modifications of the catalyst selection, concentration, inhibitors, etc., in order to provide a balance of reactivity during cure and sufficiently long shelf life and pot life. In addition, the compositions of the thermal material of the invention may also contain other additives including, but not limited to, catalysts for the curing reaction as noted above, coupling agents for the filler, adhesion promoters, coloring agents, and other additives known to those skilled in the art.

Generally, the TIM 7 in the package 1 of the invention has two key functions. One function is to dissipate heat and the other function is to serve as a material that absorbs stresses. The stresses on the TIM are due to the mismatch in the coefficients of thermal expansion of the materials being coupled by the TIM, i.e., the silicon die and the copper metal of the heat spreader. The TIM between the die and the heat spreader receives stresses exerted from the die and the heat spreader. It is observed that the gel polymer matrix TIMs having a reduced modulus, i.e., a storage shear modulus G' less than about 100 kPa at 125° C., according to the invention are better able to absorb these stresses without delaminating from the surfaces. It is also observed that these TIMs according to the present invention have reduced thermal interfacial resistance and are therefore better able to conduct heat. These observations are substantiated by the results of performance tests reported below.

A study was made of different gel TIM formulations, each with a different storage shear modulus G', but the same bulk thermal conductivity of 3.4 W/mK. There are several formulation factors that significantly impact the G' and G" of the gel TIM. These include the silicone oil molecular weight, the crosslinker molecular weight, the ratio of silicone oil to crosslinker, and the number of crosslinking sites per crosslinker molecule. The gel TIMs used in the study comprised the same basic formulation as described above except that to varying degrees some or all of the crosslinker was replaced with chain extender, which was a silicone polymer comprising terminal siloxane hydride units. In these formulations, the concentration of crosslinker plus chain extender was adjusted as needed in order to maintain a constant ratio of vinyl groups from the polymer matrix structure of FIG. 6 to total siloxane hydride groups from the chain extender and crosslinker of FIGS. 7 and 8, respectively. Upon reaction of the chain extender with vinyl-terminated silicone oil during cure, a longer linear silicone polymer is produced, which results in a material with lower crosslink density. In the extreme case in which all of the crosslinker is replaced with chain extender, the resulting silicone matrix material is linear, i.e., does not have any side chains or crosslinks.

A rheometer (i.e., a strain-controlled rheometer) was used for monitoring the curing reaction of the different gel TIM formulations and measuring the G' and G" of the cured gels at elevated temperatures. In each of the tests, about 0.5 grams of one of the thermal materials was placed between two 25 mm parallel plates with a gap of 2 mm. The sample was heated to 125° C. at a rate of 10° C./min and then held at that temperature for 1 hour while subjecting the sample to a shear stress by rotating the upper plate at 1 rad/sec at constant strain of 10%. The dynamic shear viscosity (Eta*) was also measured. Eta* is given by equation (1).

$$Eta^* = \sqrt{\eta'^2 + \eta''^2} \quad (1)$$

where η' and η" are real and imaginary parts of the shear viscosity. For a perfectly elastic solid, G' is equal to a constant shear modulus and G" is 0, whereas for Newtonian fluid, η' is just the true fluid viscosity and η" is zero. One way to interpret G' and G" is that G' is the elastic part and G" is the viscous part of the mechanical response of the material. If the material behaves more like a solid then G'/G">1 and if it behaves more like a liquid G'/G"<1. Therefore, when during cure the grease-like thermal material of the invention transitions into the gel stage, then G'/G">1 and crossover of the G' and G" curves is observed. The storage shear modulus G' and loss shear modulus G" were measured as a characteristic property for the gels as it was not possible to measure properties such as Young's modulus or hardness for these gels which, although fully cured, were very soft such that measurement of hardness was not possible.

Figure 2B:
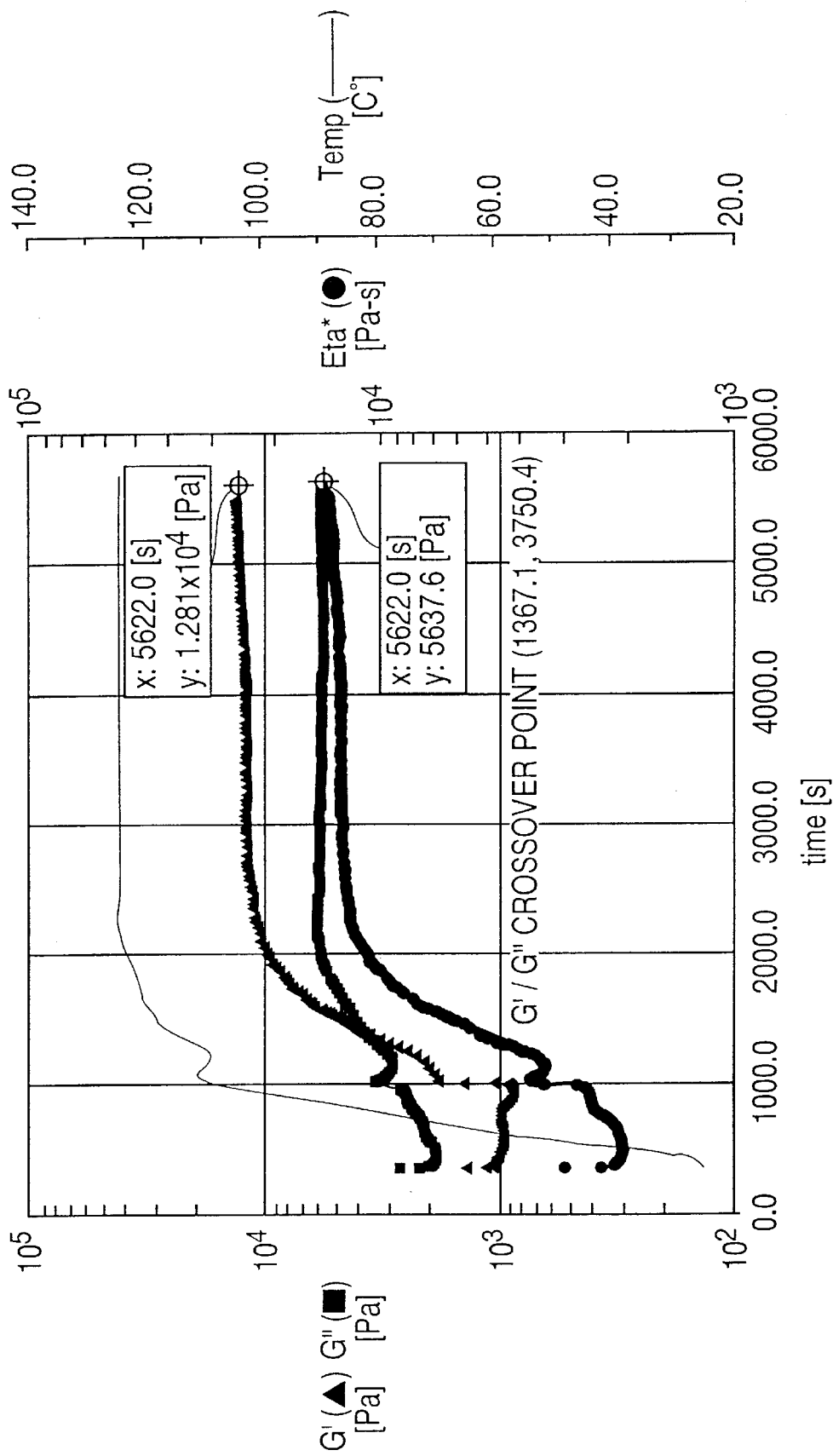
FIG. 2B are RDA curves of another thermal material (TIM 2) of the invention.
Figure 3:
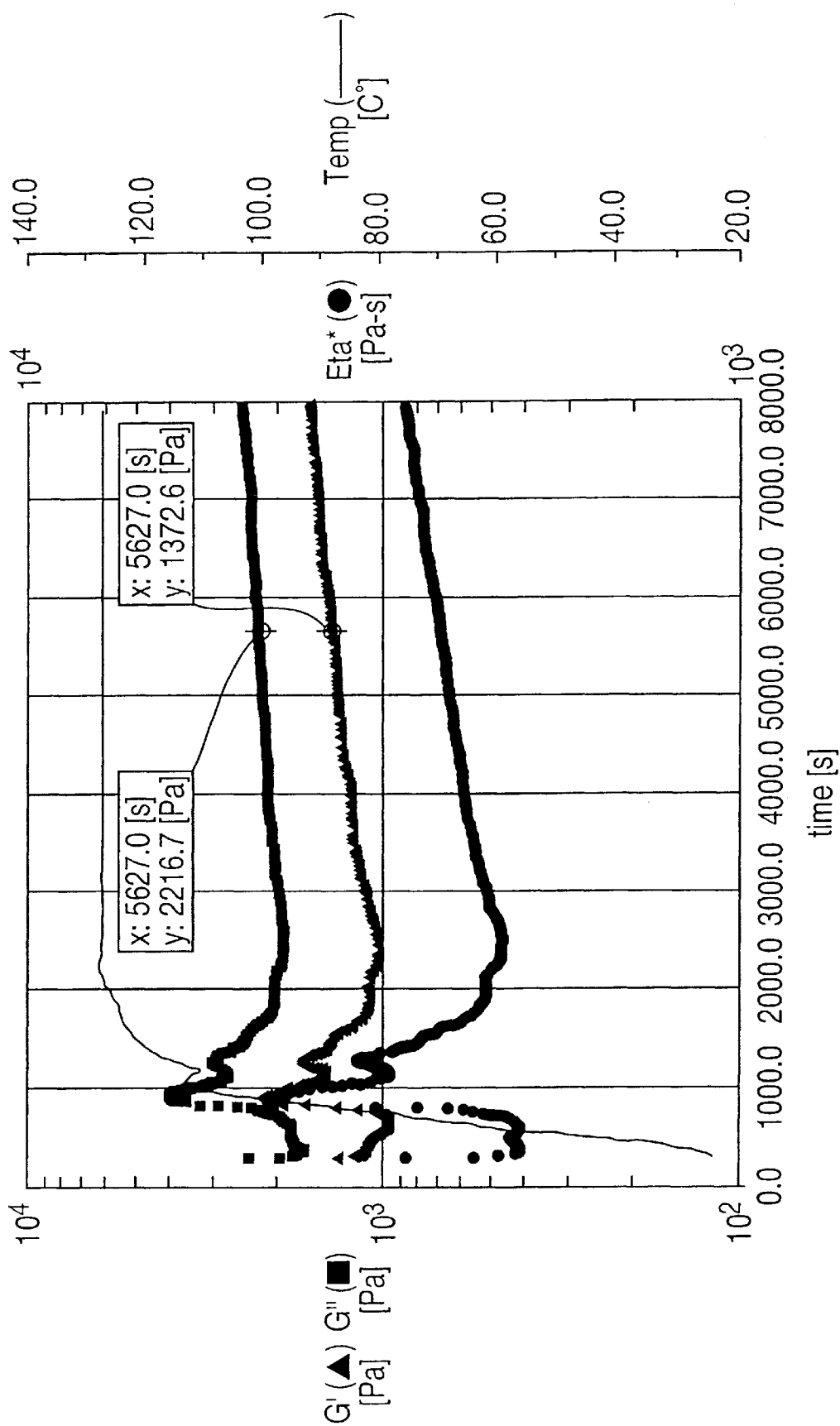
FIG. 3 are RDA curves of a comparative thermal material (TIM 3) that does not have a G'/G" crossover.

Measurement curves from the rheometer tests of two materials, TIM 1 and TIM 2, according to the invention are shown in FIGS. 2A and 2B. Curves of a comparative material, TIM 3, wherein 100% of the crosslinker was replaced with chain extender are depicted in FIG. 3. In the TIM 1 material reported in FIG. 2A, 60% of the crosslinker was replaced with chain extender, and the measured values for G' and G" were 36.9 kPa and 13.8 kPa, respectively, after a curing time of 5630 seconds. The curves for G' and G" cross over one another such that G'/G" for the cured material is 2.67. In contrast, the comparative material TIM3 reported in FIG. 3 has curves with no crossover and values for G' and G" of 1.37 and 2.21, respectively. Thus, G'/G" is 0.62. The material TIM 2 reported in FIG. 2B had an amount of its crosslinker greater than 60 but less than 100% replaced with chain extender and yielded measured values for G' and G" of 12.8 and 5.6 kPa, respectively. The value of G'/G" for the cured material is 2.27, reflecting the crossover of the curves apparent in FIG. 2B.

Table I below sets forth the different measured values for G' and G" for four of the different Theological formulations, A, B, C and D, of the gel TIM.

TABLE I

| Formulation | G' (k Pa) | G" (k Pa) | G'/G" |
|---|---|---|---|
| A | 460 | 46.7 | 9.85 |
| B | 215 | 39.6 | 5.43 |
| C | 36.9 | 13.81 | 2.67 |
| D | 1.37 | 2.21 | 0.62 |

Formulation C is material TIM 1 of the invention whose curves of G' and G" are reported in FIG. 2A. Formulation D is the comparative material TIM 3 are reported in FIG. 2A. Formulation D is the comparative material TIM 3 reported in FIG. 3. Formulations A and B are materials having 0% and 40%, respectively, of crosslinker replaced with chain extender.

Performance tests were performed on test coupons, in a package like that in FIG. 1, of the four different thermal material formulations A, B, C and D. Test coupons were prepared by placing uncured TIM between silicon and a copper heat spreader, subjecting the sample to a force of about 60 psi, and curing the samples at 125° C. for one hour. The bond line thicknesses (BLTs) of the samples were determined to be about 30 μm. The thermal materials of the invention advantageously permit BLTs which are preferably within the range of 10–50 μm. The cured TIM of formulation C according to the invention exhibited greater adhesive strength than cohesive strength as indicated by predominately cohesive failure of the material upon removal of the heat spreader by both lid shear and lid pull tests.

Figure 9:
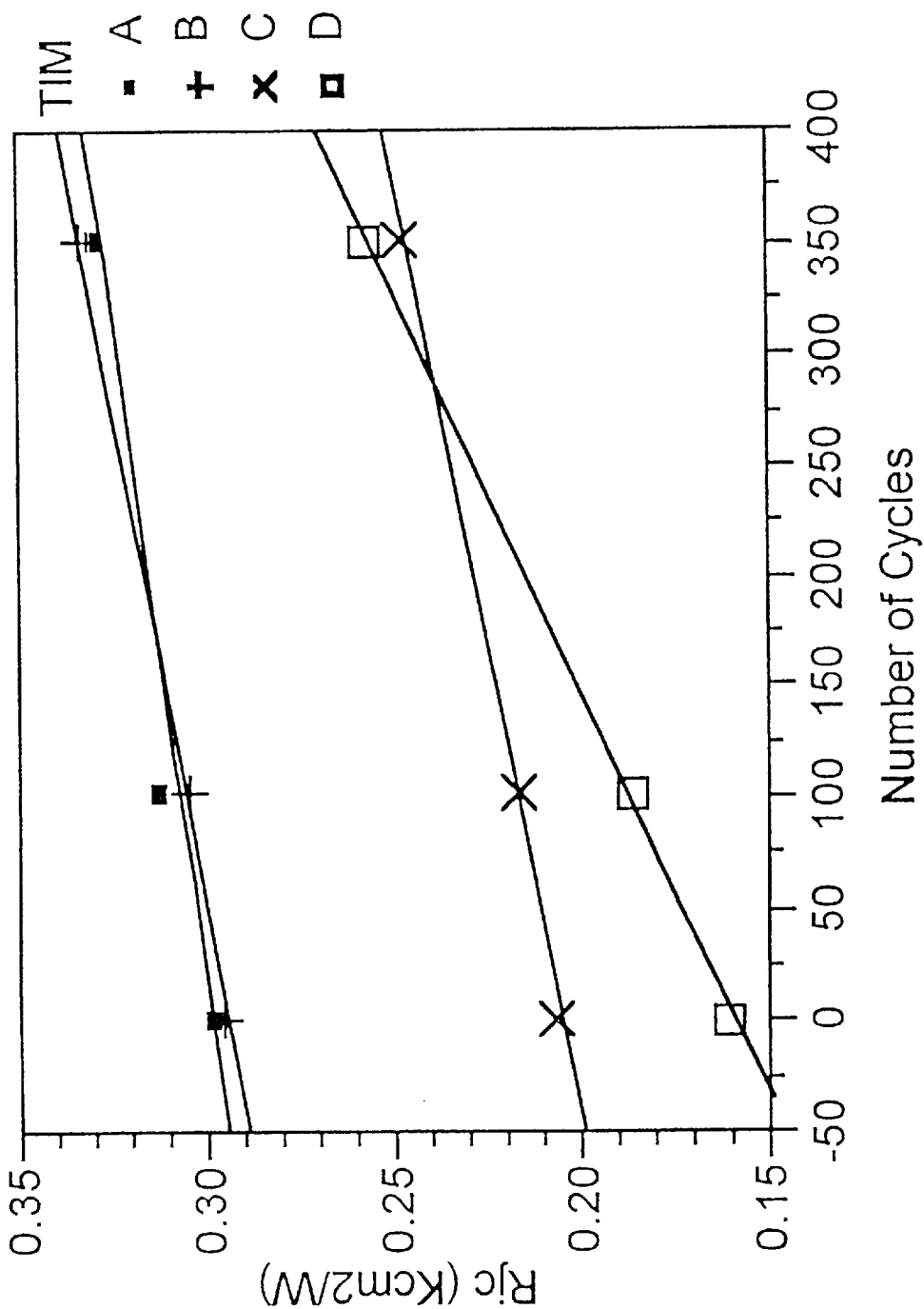
FIG. 9 shows plots of the mean thermal resistance (Rjc) versus the number of temperature cycles for test coupons comprising gel TIMs used in the study where the slopes of the plots represent the degradation rate of the material during temperature cycling.

The mean total thermal resistance (Rjc) was measured for each gel TIM by averaging the value of 16 individual samples in this configuration. The samples were then subjected to temperature cycling from 125° C. to −55° C., with Rjc measured after 100 and 250 cycles. The plot of Rjc versus the number of cycles for each of the four gel TIM formulations used in the study is presented in FIG. 9. The plots show that the initial Rjc value (number of cycles=0) decreases with decreasing G' value. The slope of each plot is interpreted to be the degradation rate of thermal performance during temperature cycling. The rate of degradation of the material D with no G' and G" crossover is noticably greater than that of TIM C of the present invention. The initial contact resistance with the TIM C of the invention is also substantially less than that with TIMs A and B.

Figure 4:
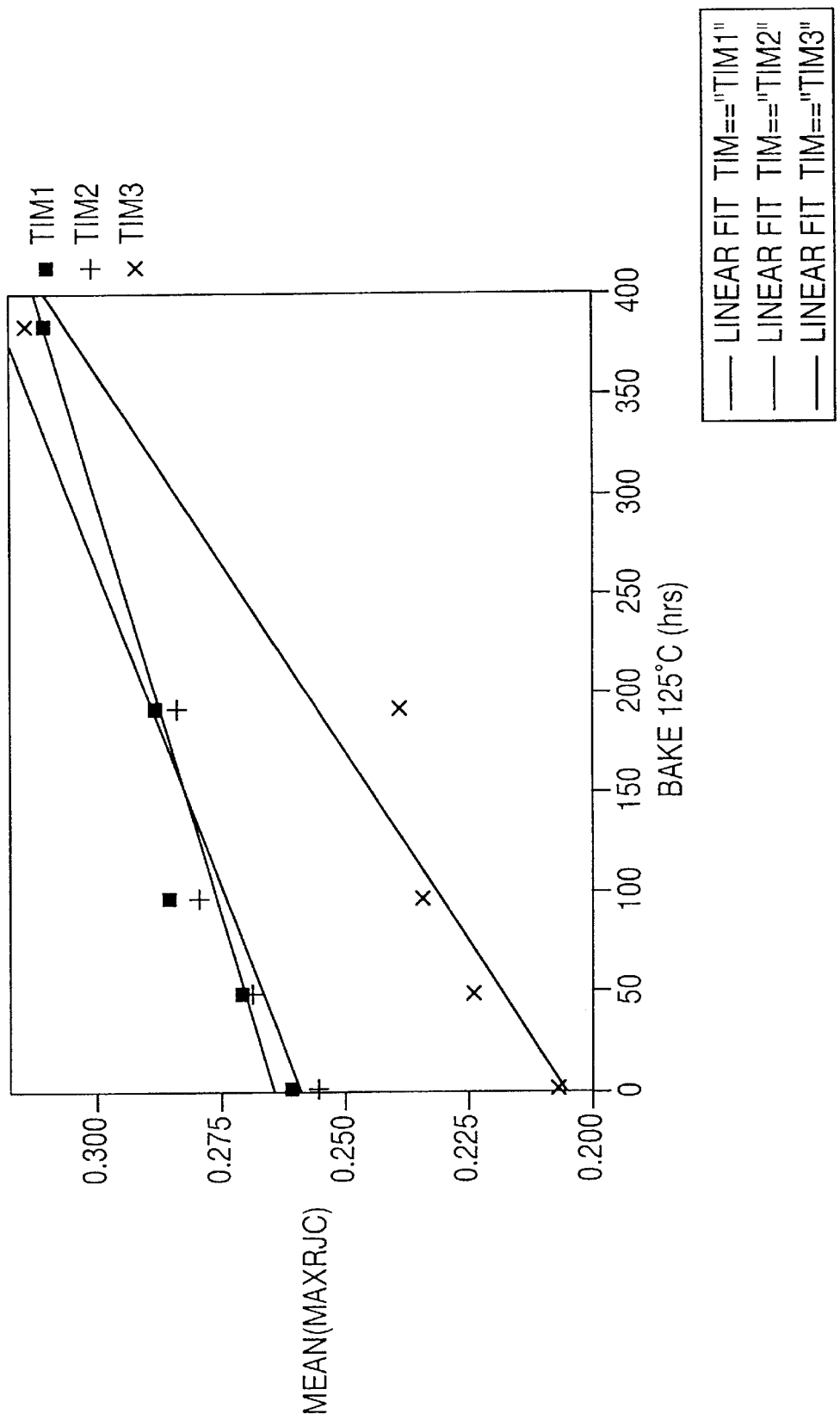
FIG. 4 presents plots of measured thermal resistance, Rjc, values obtained for a large-die flip-chip test vehicle comprising respective ones of the TIMs from FIGS. 2A, 2B and 3 as a function of baking time at 125° C. for up to 384 hours.
Figure 10:
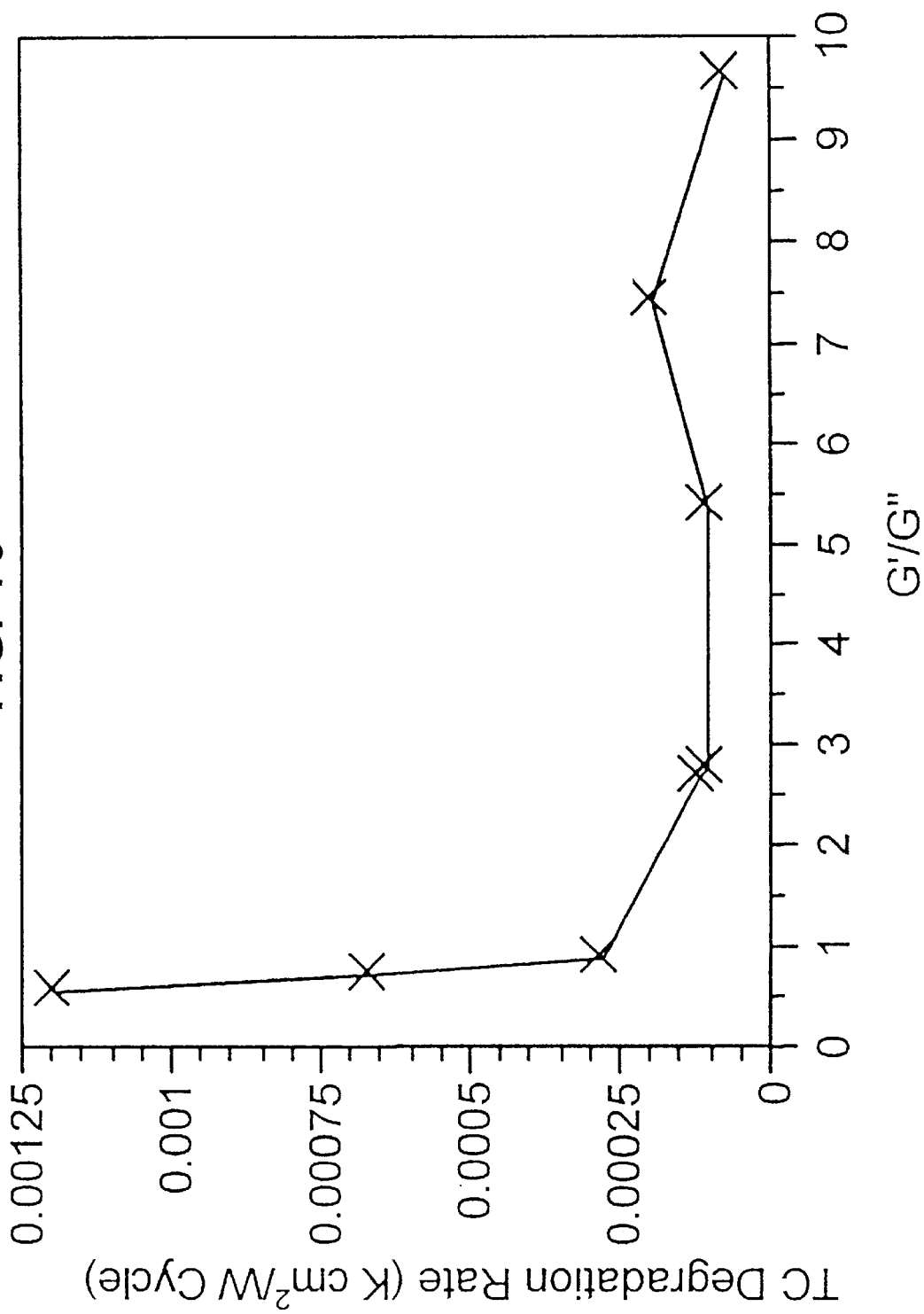
FIG. 10 is a plot of the temperature cycling degradation rate of thermal resistance reported in FIG. 9 as a function of G'/G", where the data points are G'/G" for each sample studied.

FIG. 10 presents a plot of degradation rate in temperature cycling (determined as described above) versus the ratio G'/G" for a series of TIMs that include the four gel TIM formulations used in the study as well as several additional TIM formulations. The data points are G'/G" for each sample studied. The plot shows that TIM formulations that lack a gel point such that G'/G" is less than one rapidly degrade during temperature cycling, while gel TIMs with G'/G" greater than one show essentially the same degradation rate during temperature cycling. Similar degradation of thermal performance was also observed in bake as shown in FIG. 4 for the TIM1 and TIM2 materials of the invention and the comparative material TIM3.

Figure 5A:
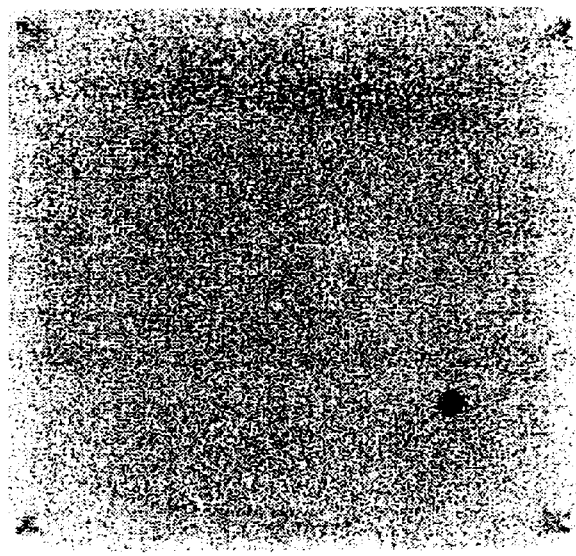
FIGS. 5A and 5B are CSAM images of test vehicles showing the development of voids during bake for comparative thermal material TIM 3 which does not have a G' and G" crossover, for respective times—after assembly (before bake)—FIG. 5A and after 125° C. bake for 384 hours—FIG. 5B.
Figure 5B:
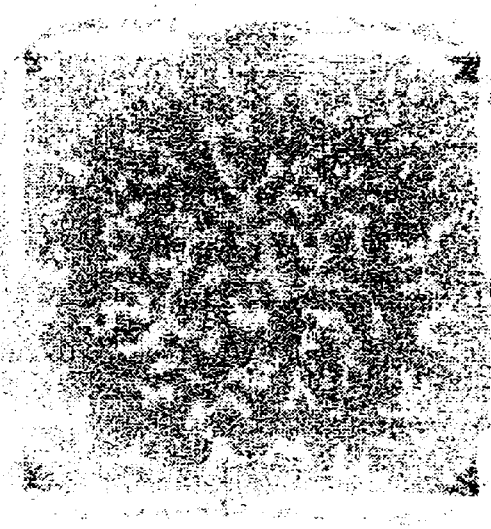

CSAM analyses revealed that the formulations that lack a G'/G" crossover tend to form voids that are very similar to those observed for grease TIMs due to pump-out. Representative initial and post reliability stress CSAM images of a test coupon comprising gel TIM D are presented in FIGS. 5A and 5B. Based on this result, according to the present invention, there exists an optimum range of values for the shear modulus of polymer TIMs minimizing thermal contact resistance with lower BLT for a given pressure while avoiding delamination and reliability test failures even in high performance electronic packages made of materials having widely different coefficients of thermal expansion. These advantages are possible where the polymer matrix with thermally conductive filler has a storage shear modulus G' at 125° C. of less than 100 kPa, and has a gel point, as indicated by a value of G'/G" of $\geq 1$, where G" is the loss shear modulus of the thermal interface material.

This concludes the description of the example embodiment. Although the present invention has been described with reference to an example embodiment thereof it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. For example, the electronic packages of the invention may have a variety of form factors including pin grid arrays, ball grid arrays and ball grid arrays with pinned interposers. The thermal materials are especially useful as the TIM between the die and the integrated heat spreader of the flip-chip packages; however, they can be used in a variety of applications including mobile and enabling applications in which a thermal interface material is needed between the chip and the heat removal hardware such as heat fins, fans, vapor chambers, and the like. In addition to variations and modifications in the component parts and/or arrangements, alternative uses will also be apparent to those skilled in the art.

We claim:

1. An electronic package comprising:
   a heat-generating electronic component;
   a thermally conductive member;
   a thermal interface material in heat conducting relation between the electronic component and the thermally conductive member;
   wherein the thermal interface material includes a polymer matrix and thermally conductive filler, which has a storage shear modulus (G') at 125° C. of less than about 100 kPa, and has a gel point, as indicated by a value for G'/G" of $\geq 1$, where G" is the loss shear modulus of the thermal interface material.

2. The electronic package according to claim 1,
   wherein the values for G' and G" are measured by a strain-controlled rheometer.

3. The electronic package according to claim 1,
   wherein the electronic component is an integrated circuit chip.

4. The electronic package according to claim 3, further comprising a substrate electrically coupled to a front side of the integrated circuit chip.

5. The electronic package according to claim 4,
   wherein the thermally conductive member is an integrated heat spreader in heat conducting relation with a back side of the integrated circuit chip via the thermal interface material.

6. The electronic package according to claim 5, further comprising a heat sink in heat conducting relation with the thermally conductive member via a further thermal interface material.

7. The electronic package according to claim 1, wherein the polymer matrix of the thermal interface material includes a crosslinked silicone polymer.

8. The electronic package according to claim 1, wherein the electronic package is a processor assembly.

9. A processor assembly comprising:
   an integrated circuit chip;
   a substrate electrically coupled to a front side of the integrated circuit chip;
   an integrated heat spreader mounted on the substrate with a planar surface of the heat spreader extending over a back side of the chip;
   a thermal interface material in heat conducting relation between the back side of the integrated circuit chip and the planar surface of the heat spreader;
   wherein the thermal interface material includes a polymer matrix and thermally conductive filler, which has a storage shear modulus (G') at 125° C. of less than about 100 kPa, and has a gel point, as indicated by a value for G'/G" of $\geq 1$, where G" is the loss shear modulus of the thermal interface material.

10. The processor assembly according to claim 9, further comprising a heat sink arranged on a side of the integrated heat spreader opposite the chip, and a further thermal interface material in heat conducting relation between the integrated heat spreader and the heat sink.

11. The processor assembly according to claim 10, wherein the further thermal interface material is the same as the thermal interface material between the chip and the integrated heat spreader.

12. A method of dissipating heat from a heat-generating electronic component comprising:
    transferring heat from the component to a thermally conductive member with a thermal interface material, which includes a polymer matrix and thermally conductive filler, located between the component and the thermally conductive member;
    wherein the method includes providing as the thermal interface material, a material which has a storage shear modulus (G') at 125° C. of less than about 100 kPa, and has a gel point, as indicated by a value for G'/G" of $\geq 1$, where G" is the loss shear modulus of the thermal interface material, where the values of G' and G" are measured by a strain-controlled rheometer.

13. The method according to claim 12, further comprising transferring heat from the thermally conductive member to a heat sink by a further thermal interface material between the thermally conductive member and the heat sink.

14. A curable material useful as thermal material comprising:

at least one crosslinkable polymer;

a crosslinker; and a thermally conductive filler;

wherein the material upon curing has a storage shear modulus (G') at 125° C. of less than about 100 kPa, and has a gel point, as indicated by a G'/G" crossover where G" is the loss shear modulus of the material, where G' and G" are measured by a strain-controlled rheometer.

15. The curable material according to claim 14, wherein the at least one crosslinkable polymer includes a silicone polymer.

16. The curable material according to claim 15, wherein the silicone polymer is a vinyl terminated silicone oil.

17. The curable material according to claim 15, wherein the crosslinker comprises a silane hydride crosslinker.

18. The curable material according to claim 14, further comprising a chain extender.

19. The curable material according to claim 18, wherein the chain extender comprises a silicone polymer having terminal silane hydride units.

20. The curable material according to claim 14, wherein the at least one cross linkable polymer includes a vinyl terminated silicone oil, and wherein the material further comprises a chain extender which includes a silicone polymer comprising terminal silane hydride units; the ratio of the chain extender to the crosslinker being such that the mole fraction of Si—H equivalents from the chain extender to the total Si—H equivalents from both the crosslinker and the chain extender is approximately 0.1 to 1.

* * * * *

UNITED STATES PATENT AND TRADEMARK OFFICE
CERTIFICATE OF CORRECTION

PATENT NO. : 6,597,575 B1  
DATED : July 22, 2003  
INVENTOR(S) : Paul Koning, James C. Matayabas and Jinlin Wang It is certified that error appears in the above-identified patent and that said Letters Patent is hereby corrected as shown below:

Title page,  
Item [57], ABSTRACT,  
Line 10, delete "." after "C".  
Line 12, delete "≧" and insert -- ≥ -- therefor.

Column 9,  
Line 61, delete "." after "C".  
Line 63, delete "≧" and insert -- ≥ -- therefor.

Column 10,  
Lines 37 and 58, delete "≧" and insert -- ≥ -- therefor.  
Lines 35 and 57, delete "." after "C".

Column 11,  
Line 5, delete "." after "C".

Signed and Sealed this

Seventeenth Day of August, 2004

JON W. DUDAS  
*Acting Director of the United States Patent and Trademark Office*